United States Patent [19]

Gamson et al.

[11] 4,451,552

[45] May 29, 1984

[54] FORMATION OF PRINT SURFACES

[75] Inventors: Alan R. Gamson; Phillip R. Kellner, both of London, England

[73] Assignee: Crosfield Electronics Limited, London, England

[21] Appl. No.: 346,324

[22] Filed: Feb. 5, 1982

[30] Foreign Application Priority Data

Feb. 6, 1981 [GB] United Kingdom ............... 8103775

[51] Int. Cl.³ .............................................. G03F 7/02
[52] U.S. Cl. ...................................... 430/302; 430/5; 430/271; 430/273; 430/945; 430/950
[58] Field of Search ................... 430/5, 945, 302, 260, 430/262, 324, 271, 273, 291, 950; 355/125

[56] References Cited

U.S. PATENT DOCUMENTS

| | | | |
|---|---|---|---|
| 4,126,460 | 11/1978 | Okishi | 430/300 |
| 4,168,979 | 9/1979 | Okishi et al. | 430/162 |
| 4,201,581 | 5/1980 | Thomas et al. | 430/396 |
| 4,216,289 | 8/1980 | Oda et al. | 430/302 |
| 4,238,560 | 12/1980 | Nakamura et al. | 430/162 |
| 4,245,003 | 1/1981 | Oransky et al. | 428/323 |
| 4,268,611 | 5/1981 | Okishi et al. | 430/302 |

*Primary Examiner*—John E. Kittle
*Assistant Examiner*—José G. Dees
*Attorney, Agent, or Firm*—Sughrue, Mion, Zinn, Macpeak and Seas

[57] ABSTRACT

A print surface is formed by photoexposure of a photocurable resin layer through a photomask comprising an image-wise distribution of opaque material on its image surface, and sticking of the image surface to the resin layer during photoexposure is prevented by providing over the image surface a clear thin film of a natural gum or other material that is impermeable to softeners such as alcohols that are liberated from the resin layer. A coated photomask may be made by image-wise laser scanning of a transparent sheet to which opaque material such as graphite is bonded by a binder such as an alkyl cellulose, followed by application of the film over the resultant image-wise distribution of opaque material.

11 Claims, No Drawings

FORMATION OF PRINT SURFACES

A print surface may be formed from a layer of photocurable resin by a method comprising holding against the resin layer a photomask comprising a transparent sheet having an image surface that is in contact with the resin layer and that comprises an image of opaque material bonded to the sheet by an organic binder, illuminating the sheet and thereby subjecting the resin to image-wise photoexposure, removing the photomask and developing the resin layer. Suitable photocurable resins are readily available commercially and preformed layers of them, for instance in the form of printing plates, are readily available under various trade names, for instance, Napp, Grace and Nyloprint.

It is possible to use the photomask for only one exposure, in which event it would be destroyed after a single use, but generally it is desirable to use the photomask for several, for instance four, exposures with the result that it is necessary to be able to remove it from the layer of photocurable resin without damaging it.

If the image surface of the photomask is not held against the resin layer the print definition is impaired. However if it is held against the resin layer it is found that there is often a serious risk of the opaque material sticking to the resin layer, with the result that when the photomask is removed the image in the image surface tends to be damaged, so that the mask cannot be reused, and the print surface also may be impaired.

We have now surprisingly found that the sticking problem arises from the release by the resin layer of a softener that can soften the organic binder and that this softening can be substantially prevented by providing a substantially clear film that covers the image surface and that is substantially impermeable to the softener and that is less than 25 microns thick.

Thus we have established that the resin layer releases a softener and that the adhesion of the opaque material to the resin layer is primarily due to this softener softening and therefore weakening the binder. The softener may be liberated from the resin layer before photoexposure, as a result of being in the layer throughout, but a particular problem arises from the fact that photocuring of photocurable resin layers usually liberated material which acts as softener.

The precise material that is liberated will of course depend upon the particular photocurable resin in the resin layer but the materials which are normally liberated and which cause most trouble are generally alcohols containing 3, 4 or 5 carbon atoms, with alcohols containing 3 carbon atoms, especially isopropanol, being a particular problem. Also ketones containing up to 5 carbon atoms may be liberated and may act as softeners. Some other low molecular weight organic solvents may also be liberated and serve as softeners.

Napp plates give particular problems of stickiness, and they tend to be tacky even before photoexposure, and so the invention is of particular value when applied to them. However it is also of value when applied to other photocurable printing plates, for example Nyloprint.

The transparent sheet may be any suitable substrate, for instance polystyrene or polyester.

The binder and the image forming material in the photomask may be the same material but generally they are different. The image forming material may be any opaque material that can be distributed image-wise on the image surface and held to the transparent sheet by a suitable binder. For instance the image forming material may be silver, formed by photodecomposition of silver halide, or chromic oxide or may simply be an inert opaque material such as graphite. The binder is a material that is softened by the softener liberated from the resin layer since the manufacture of the photomask generally requires the use of a relatively weak binder that is readily softened by, for instance, isopropanol. The normal binder is a cellulose derivative, for instance a $C_{1-4}$ alkyl cellulose such as methyl or, preferably, ethyl cellulose or nitrocellulose or is some other organic ester such as an alkyl propionate, generally methyl or ethyl propionate, or the corresponding butyrates.

The photomasks are generally made from a photomask blank that comprises an overall coating of opaque material bonded to the sheet by the binder. The imagewise distribution of the opaque material may be achieved in any suitable manner. For instance imagewise heating of the binder may cause it to melt and the opaque coating to reticulate, and thus become light transmitting. This for instance is a preferred method of making a photomask using chromic oxide as the opaque material.

The invention however is of particular value when the image-wise distribution is obtained by transferring opaque material off the sheet. Thus a sheet carrying an overall layer of the opaque material may be subjected to image-wise laser scanning so as to displace the binder and opaque material from the surface.

Accordingly the invention includes also a method of making a photomask comprising subjecting to imagewise laser scanning a mask comprising a transparent sheet carrying an image surface comprising a coating of opaque material bonded to the sheet by an organic binder and thereby effecting image-wise displacement of binder and opaque material to form an image surface carrying an image-wise distribution of the opaque material bonded to the sheet by an organic carrier, and applying over the image surface a solution that will form a film that covers the image surface and that is less than 25 microns thick. The transfer of the opaque material may be onto a substrate, such as anodised aluminium, against which it is laid during the scanning. The transferred material may be baked onto the substrate.

When the photomask is to be made by this method it is particularly desirable that the opaque material should be an inert material such as graphite and that the binder should be ethyl cellulose or other cellulose derivative or one of the other weak binders identified above. The use of a weak binder facilitates transfer of the image forming material by laser scanning.

Simple provision of a film that is impermeable to the softener may itself not be sufficient to avoid problems during photoexposure because if the applied film is totally impermeable to the softener there is then a risk that bubbles of the softener will be trapped between the film and the resin layer. We have surprisingly found that these problems can be avoided if the film is both impermeable to the softener and has a matt surface, generally as a result of including a matting agent having a particle size less than the film thickness. Suitable matting agents include silica and inorganic salts of fatty acids, for instance aluminum stearate.

The provision of a matt surface is also desirable in that it reduces the risk of undesirable optical effects being created between the resin layer and the glossy film that might otherwise be in contact with it. The amount of matting agent is typically from 1 to 20 parts by weight based on the film forming material.

Since separation of the opaque material from the resin layer reduces print quality the film between the opaque material and the resin layer must be as thin as possible and preferably it is substantially less than 25 microns in thickness. Generally it is below 10 microns, typically 0.5 to 5 microns, with best results generally being obtained with a film thickness of 1 to 3 microns. All these thicknesses are the thicknesses measured over the opaque material. The film in the areas free of opaque material may be slightly thicker.

The film must be formulated from a material that is capable of providing a film that, at the chosen thickness, is impermeable to the softener and is sufficiently clear not to interfere significantly with the photoexposure and that can be applied without damaging the photomask, for instance without weakening the binder. Thus it is necessary that the film should be capable of being applied from a solution that will dry quickly without the need for high drying temperatures, which might give distortion of the mask, and without dissolving the binder. It is difficult to formulate many of the conventional film forming materials, such as epoxies, urethanes, acrylics and styrene based coatings, or coatings based on polyvinyl alcohol, in such a way that they can form the desired very thin films. Out of the various natural and synthetic film forming materials we have surprisingly found that the best solutions are those based on natural gums, for instance tragacinth, or, especially, gum arabic. We find such materials, and especially gum arabic, can be formulated as aqueous solutions that can easily be thinned to be suitable for roller coating or spraying to the desired film thickness, they dry quickly in air at ambient temperature and they give films that are very hard and tough even though they are very thin. Thus the preferred method of making the photomask comprises applying over the image surface a coating of a solution of gum arabic or other suitable natural or synthetic film forming polymeric material and then drying the coating, preferably within two minutes. The solution is preferably in water, although some alcohol, such as methanol, ethanol or isopropanol, may be included.

The dried photomask may then be held against the layer of resin and subjected to overall photoexposure, e.g. with ultraviolet radiation, in conventional manner so as to achieve image-wise photoexposure of the resin. The mask may then be removed, optionally for reuse, and the resin layer developed in conventional manner to remove uncured resin and to produce the chosen image-wise distribution of surface properties. The resin layer may then be used for planographic printing, such as lithography, in conventional manner or used in any other suitable printing method.

The following is an example of the invention.

Transparent polystyrene about 100 microns thick is coated with a layer of graphite bonded to the polystyrene by ethyl cellulose. The resultant sheet is subjected to image-wise laser exposure while in contact with anodised aluminium, which results in image-wise transfer of graphite to leave an image of graphite bonded to the sheet by ethyl cellulose.

25 parts by weight gum arabic are mixed into 70 parts by weight distilled water and the mixture boiled for about 30 minutes. A mixture of about 2 parts aluminium stearate and 3 parts isopropanol is then stirred into the mixture. The aluminium stearate serves as a matting agent and could be replaced by, for instance, submicron silica.

The solution is sprayed as a uniform layer over the image, to form a wet film thickness of around 5 microns. It is then dried either while exposed naturally to air or under a heated air curtain at a temperature of up to about 40° C. Drying occurs within about 2 minutes. The dry film thickness is about 2 or 3 microns.

The coated image sheet is then laid against a Napp plate, held in position by vacuum in conventional manner, and the plate is then subjected to ultraviolet illumination so as to achieve image-wise photoexposure of the plate. The sheet is then removed and the plate developed by washing with water or other appropriate solvent in the usual way so as to remove uncured resin.

It is found that there is no adhesion between the gum arabic layer and the plate with the result that the transparent sheet carrying the image can be reused.

If it is desired to form the gum arabic layer by roller coating instead of by spraying it may be desirable to increase the concentration of gum arabic in the coating solution up to, for instance, 30%.

We claim:

1. A process for forming a print surface from a layer of photocurable resin by holding against the resin layer a photomask comprising a transparent sheet carrying an image surface that is in contact with the resin layer and that comprises an image-wise distribution of opaque material bonded to the sheet by an organic binder, illuminating the sheet and thereby subjecting the resin layer to image-wise photoexposure, removing the sheet and developing the resin layer, characterised in that the resin layer releases a softener that can soften the organic binder and adhesion of the opaque material to the resin layer is substantially prevented by a substantially clear film that covers the image surface and that is substantially impermeable to the softener and that is less than 25 microns thick.

2. A process according to claim 1 characterised in that the photomask has been made by subjecting to image-wise laser scanning a mask comprising the transparent sheet carrying an image surface comprising a coating of the opaque material bonded to the sheet by the binder, and thereby effecting an image-wise displacement of the binder and opaque material to form the image-wise distribution of opaque material bonded to the sheet by the binder, applying over the image surface a coating of a solution of a natural or synthetic film forming polymeric material and drying the coating and thereby forming the film.

3. A process according to claim 1 characterised in that the film has a matt surface.

4. A process according to claim 1 in which the film is from 0.5 to 5 microns thick.

5. A process according to claim 1 characterised in that the film is formed of a natural gum.

6. A process according to claim 5 characterised in that the film is formed of gum arabic.

7. A process according to claim 1 characterised in that the binder is methyl or ethyl cellulose.

8. A process according to claim 1 characterised in that the opaque material is graphite.

9. The process of claim 1, wherein the substantially clear film is of uniform thickness.

10. A process for forming a print surface from a layer of photocurable resin by holding against the resin layer a photomask comprising a transparent sheet carrying an image surface that is in contact with the resin layer and that comprises an image-wise distribution of opaque graphite bonded to the sheet by an organic binder which is selected from the group consisting of alkyl celluloses, alkyl propionates and alkyl butyrates, illuminating the sheet and thereby subjecting the resin layer to image-wise photo exposure, removing the sheet and developing the resin layer, characterized in that the resin layer releases a softener which is an aliphatic alcohol having 3, 4 or 5 carbon atoms or a ketone of up to 5 carbon atoms that can soften the organic binder and adhesion of the opaque material to the resin layer is substantially prevented by a substantially clear film of a natural gum that covers the image surface and that is substantially impermeable to the softener and that is less than 25 microns thick.

11. A process for forming a print surface from a layer of photocurable resin by holding against the resin layer a photomask comprising a transparent sheet carrying an image surface that is in contact with the resin layer and that comprises an image-wise distribution of opaque material bonded to the sheet by an organic binder selected from the group consisting of alkyl celluloses, alkyl propionates and alkyl butyrates, illuminating the sheet and thereby subjecting the resin layer to image-wise photoexposure, removing the sheet and developing the resin layer, characterized in that the resin layer releases a softener selected from the group consisting of aliphatic alcohols containing 3, 4 or 5 carbon atoms which can soften the organic binder and adhesion of the opaque material to the resin layer is substantially prevented by a substantially clear film which is a matt film formed of a natural gum and a matting agent having a particle size less than the film thickness that covers the image surface, which is substantially impermeable to the softener and which is less than 25 microns thick.

* * * * *